United States Patent
Schulze et al.

(10) Patent No.: US 12,272,738 B2
(45) Date of Patent: *Apr. 8, 2025

(54) METHODS OF FORMING SEMICONDUCTOR DEVICES IN A LAYER OF EPITAXIAL SILICON CARBIDE

(71) Applicant: Infineon Technologies AG, Neubiberg (DE)

(72) Inventors: Hans-Joachim Schulze, Taufkirchen (DE); Roland Rupp, Lauf (DE); Francisco Javier Santos Rodriguez, Villach (AT)

(73) Assignee: Infineon Technologies AG, Neubiberg (DE)

( * ) Notice: Subject to any disclaimer, the term of this patent is extended or adjusted under 35 U.S.C. 154(b) by 51 days.

This patent is subject to a terminal disclaimer.

(21) Appl. No.: 18/351,600

(22) Filed: Jul. 13, 2023

(65) Prior Publication Data

US 2023/0361196 A1 Nov. 9, 2023

Related U.S. Application Data

(63) Continuation of application No. 17/314,672, filed on May 7, 2021, now Pat. No. 11,735,642, which is a
(Continued)

(30) Foreign Application Priority Data

Mar. 22, 2018 (DE) .......................... 102018106866.2

(51) Int. Cl.
*H01L 29/66* (2006.01)
*H01L 21/02* (2006.01)
(Continued)

(52) U.S. Cl.
CPC .. *H01L 29/66068* (2013.01); *H01L 21/02378* (2013.01); *H01L 21/02447* (2013.01);
(Continued)

(58) Field of Classification Search
CPC ......... H01L 21/02378; H01L 21/02447; H01L 21/02529; H01L 21/7806; H01L 21/7813;
(Continued)

(56) References Cited

U.S. PATENT DOCUMENTS 7,728,413 B2 6/2010 Iwade et al.
2001/0055881 A1 12/2001 Laermer et al.
(Continued)

FOREIGN PATENT DOCUMENTS

CN 102543870 A * 7/2012 ....... H01L 21/76224
DE 102007021991 A1 * 11/2008 ....... H01L 21/02378
(Continued)

OTHER PUBLICATIONS

Ji, Shiyang, "An empirical growth window concerning the input ratio of HCl/SiH4 gases in filling 4H-SiC trench by CVD", Applied Physics Express 10, 055505, Apr. 26, 2017, pp. 1-4.
(Continued)

*Primary Examiner* — Zandra V Smith
*Assistant Examiner* — Molly K Reida
(74) *Attorney, Agent, or Firm* — Murphy, Bilak & Homiller, PLLC

(57) ABSTRACT

A method includes: providing a layer of porous silicon carbide supported by a silicon carbide substrate; providing a layer of epitaxial silicon carbide on the layer of porous silicon carbide; forming semiconductor devices in the layer of epitaxial silicon carbide; and separating the silicon carbide substrate from the layer of epitaxial silicon carbide at the layer of porous silicon carbide. The layer of porous silicon carbide includes dopants defining a resistivity of the
(Continued)

layer of porous silicon carbide. The resistivity of the layer of porous silicon carbide is different from a resistivity of the silicon carbide substrate. Additional methods are described.

19 Claims, 13 Drawing Sheets

Related U.S. Application Data continuation of application No. 16/360,652, filed on Mar. 21, 2019, now Pat. No. 11,031,483.

(51) Int. Cl.

| | | |
|---|---|---|
| H01L 21/04 | (2006.01) | |
| H01L 21/683 | (2006.01) | |
| H01L 21/78 | (2006.01) | |
| H01L 29/08 | (2006.01) | |
| H01L 29/10 | (2006.01) | |
| H01L 29/16 | (2006.01) | |
| H01L 29/739 | (2006.01) | |
| H01L 29/78 | (2006.01) | |

(52) U.S. Cl.
CPC .... *H01L 21/02529* (2013.01); *H01L 21/0262* (2013.01); *H01L 21/02634* (2013.01); *H01L 21/02658* (2013.01); *H01L 21/0475* (2013.01); *H01L 21/048* (2013.01); *H01L 21/6835* (2013.01); *H01L 21/78* (2013.01); *H01L 21/7806* (2013.01); *H01L 21/7813* (2013.01); *H01L 29/0804* (2013.01); *H01L 29/0882* (2013.01); *H01L 29/1095* (2013.01); *H01L 29/1608* (2013.01); *H01L 29/66053* (2013.01); *H01L 29/7395* (2013.01); *H01L 29/7802* (2013.01)

(58) Field of Classification Search
CPC ........... H01L 29/1608; H01L 29/66053; H01L 29/0445; H01L 21/0405; H01L 29/6606; H01L 29/66068
See application file for complete search history.

(56) References Cited

U.S. PATENT DOCUMENTS

| | | |
|---|---|---|
| 2003/0056718 A1 | 3/2003 | Kawahara et al. |
| 2004/0142542 A1 | 7/2004 | Murphy et al. |
| 2006/0063352 A1 | 3/2006 | Barlocchi et al. |
| 2007/0052072 A1 | 3/2007 | Iwade et al. |
| 2011/0266655 A1* | 11/2011 | Mitani .............. H01L 21/76259 257/618 |
| 2013/0065379 A1 | 3/2013 | Schulze et al. |
| 2013/0092956 A1 | 4/2013 | Ishibashi et al. |
| 2013/0115755 A1 | 5/2013 | Engelhardt et al. |
| 2014/0087541 A1 | 3/2014 | Werner et al. |
| 2014/0252373 A1 | 9/2014 | Mauder et al. |
| 2015/0021624 A1 | 1/2015 | Meyer et al. |
| 2015/0214040 A1 | 7/2015 | Celler |
| 2016/0118465 A1 | 4/2016 | Li et al. |
| 2016/0197227 A1* | 7/2016 | Forrest .................. H01L 21/187 438/691 |
| 2016/0307792 A1 | 10/2016 | Werner et al. |
| 2017/0278930 A1 | 9/2017 | Ruhl et al. |
| 2018/0005912 A1* | 1/2018 | Oh ........................ H01L 21/561 |
| 2018/0047619 A1 | 2/2018 | Lehnert et al. |

FOREIGN PATENT DOCUMENTS

| | | |
|---|---|---|
| DE | 102012108473 A1 | 3/2013 |
| DE | 102012110603 A1 | 5/2013 |
| DE | 102013110126 A1 | 3/2014 |
| DE | 102016114949 A1 | 2/2018 |
| JP | 2000349264 A | 12/2000 |
| JP | 2000349267 A | 12/2000 |
| JP | 2003095798 A | 4/2003 |
| JP | 2004134672 A | 4/2004 |
| JP | 2006036609 A | 2/2006 |
| JP | 2009130266 A | 6/2009 |
| JP | 2013239606 A | 11/2013 |
| JP | 2014179605 A | 9/2014 |
| WO | 2017045598 A1 | 3/2017 |

OTHER PUBLICATIONS

Leitgeb, Markus , et al., "Stacked Layers of Different Porosity in 4H SiC Substrates Applying a Photoelectrochemical Approach", Journal of The Electrochemical Society, 164 (12) E337-E347 (2017), Aug. 24, 2017, 337-347.

Lendenmann, H. , et al., "Degradation of SiC bipolar devices: Sources and Consequences of Electrically Active Dislocations in SiC", Materials Science Forum; vols. 433-436;, 2003, pp. 901-906.

Matsunami, Hiroyuki , et al., "Step-controlled epitaxial growth of SiC: high quality homoepitaxy", Materials Science and Engineering, R20, No. 3, Aug. 1997, pp. 125-166.

Savkina, N. S. , et al., "Characterization of 3C-SiC/6H-SiC Heterostructures Grown by Vacuum Sublimation", Materials Science Forum; vols. 433-436, 2003, pp. 293-296.

Solanki, C.S. , et al., "Porous silicon layer transfer processes for solar cells", Solar Energy Materials & Solar Cells, vol. 83, 2004, 101-113.

Swoboda, Marko , et al., "Laser Assisted SiC Wafering Using COLD SPLIT", Materials Science Forum; vol. 897, 2017, pp. 403-406.

* cited by examiner

FIG. 13
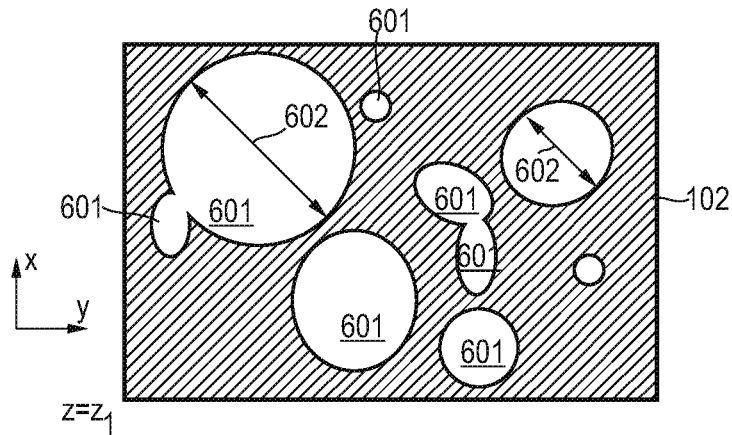
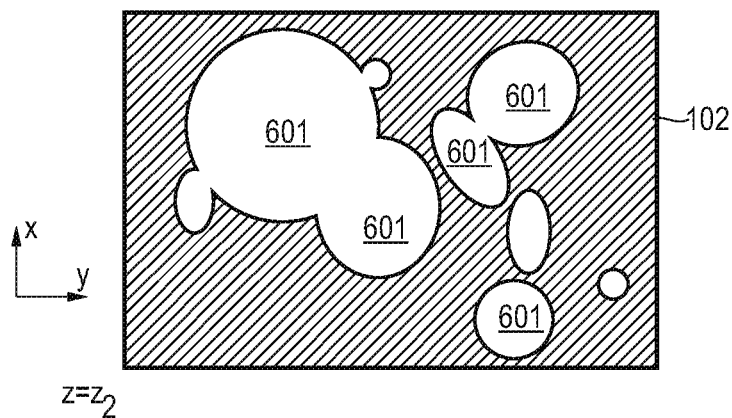
FIG. 14
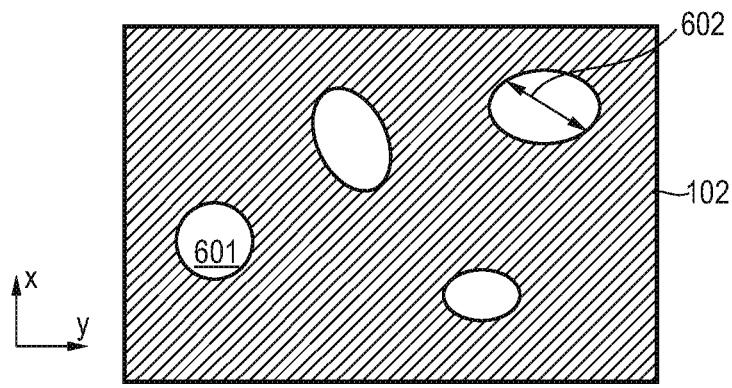

METHODS OF FORMING SEMICONDUCTOR DEVICES IN A LAYER OF EPITAXIAL SILICON CARBIDE

TECHNICAL FIELD

Various examples of the invention generally relate to forming semiconductor devices in silicon carbide. Various examples of the invention specifically relate to techniques of enabling re-use of a silicon carbide substrate.

BACKGROUND

Power semiconductor devices have high voltage and/or high current switching capabilities. Power semiconductor devices therefore find applications in various fields such as high-voltage DC transmission, e.g., from offshore wind farms, smart grid components, railway traction, etc.

Power semiconductor devices are often formed with silicon carbide (SiC). SiC is a semiconductor material having a comparably wide bandgap. This facilitates the high voltage and/or high current switching capabilities.

One disadvantage of currently available SiC power semiconductor devices is the high price (at least compared to silicon devices), which is caused by, for instance, high substrate price and/or lower production yield. Therefore, a need exists for advanced techniques of forming semiconductor devices in SiC.

SUMMARY

Embodiments of a method include providing a first layer of SiC. The first layer is supported by a SiC substrate. The method also includes providing a second layer of epitaxial SiC on the first layer. The method also includes forming a plurality of semiconductor devices in the second layer. The method also includes separating the substrate from the second layer at the first layer. The first layer includes a plurality of voids.

Embodiments of a method include providing a first layer of porous SiC supported by a substrate of SiC. The method also includes providing a second layer of epitaxial SiC on the first layer. The method also includes forming a plurality of semiconductor devices in the second layer. The method also includes separating the substrate from the second layer at the first layer.

Embodiments of a wafer include a SiC substrate and a layer of SiC supported by the SiC substrate. The layer includes a plurality of voids.

Embodiments of a wafer include a SiC substrate and a porous layer of SiC supported by the SiC substrate.

It is to be understood that the features mentioned above and those yet to be explained below may be used not only in the respective combinations indicated, but also in other combinations or in isolation without departing from the scope of the invention.

BRIEF DESCRIPTION OF THE DRAWINGS

FIG. 13 schematically illustrates pores of porous SiC according to various examples.

FIG. 14 schematically illustrates pores of porous SiC according to various examples.

DETAILED DESCRIPTION

Figure 1:
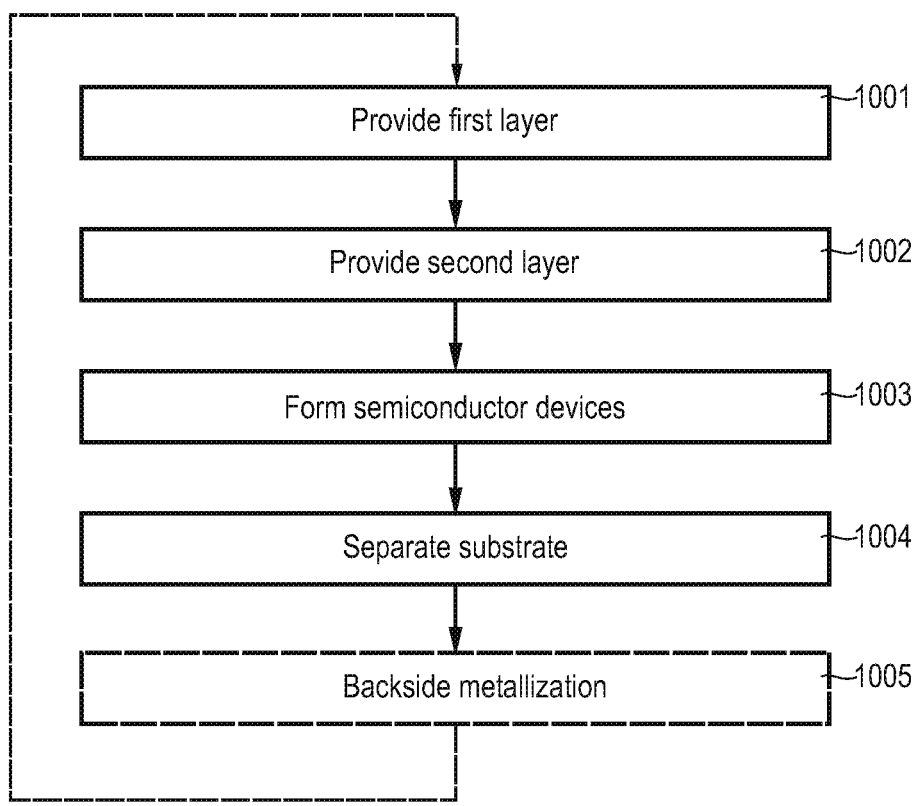
FIG. 1 is a flowchart of a method according to various examples.

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art.

Hereinafter, techniques of providing semiconductor devices in wide band-gap semiconductor material are described. The semiconductor devices are defined in a semiconductor material provided on or supported by a substrate. Hereinafter, if a semiconductor device is "defined in" a semiconductor material, this may mean that the semiconductor device comprises said material and/or is based on said material.

The term "horizontal" as used in this specification intends to describe an orientation substantially parallel to a first or main horizontal side of a semiconductor substrate or body. This can be for instance the surface of a wafer or a die. Sometimes, the horizontal direction is also referred to as lateral direction.

The term "vertical" as used in this specification intends to describe an orientation which is substantially arranged perpendicular to the first side, i.e. parallel to the normal direction of the first side of the semiconductor substrate or body.

Semiconductor devices can be implemented by two-terminal devices, e.g., diodes. Semiconductor devices can also be three-terminal devices such as a field-effect transistors (FETs), in particular metal-oxide field effect transistors (MOSFETs), insulated gate bipolar transistors (IGBTs), junction field effect transistors (JFETs), and thyristors to name a few. The semiconductor devices can also include more than three terminals.

Hereinafter, various examples of processing wide band-gap semiconductor material are described. The term "wide band-gap semiconductor material" as used in this specification intends to describe a semiconductor material with a band-gap above 1 eV. Wide band-gap semiconductor materials such as SiC or gallium nitride (GaN) have a high breakdown field strength (e.g., at least 2.5 MV/cm) and high critical avalanche field strength, respectively. Accordingly, the doping of semiconductor regions can be chosen higher compared to lower band-gap semiconductor materials, which reduces the on-state resistance Ron (also referred to as on-resistance Ron). In the following, examples are mainly explained with regard to SiC as wide band-gap semiconductor material, but similar techniques may be readily applied to other kinds and types of wide band-gap semiconductor materials.

In the various examples described herein, the semiconductor devices defined in SiC may be power semiconductor devices. The term "power semiconductor device" as used in this specification intends to describe a semiconductor device on a single chip with high voltage (in particular, at least 250 V, or at least 600 V) and/or high current switching capabilities. In other words, power semiconductor devices are intended for high current, typically in the Ampere range.

The semiconductor devices can be formed in an epitaxial layer of SiC provided on the SiC substrate. This layer is referred to as device layer, hereinafter.

As a general rule, the device layer may include sublayers. For example, a sublayer may implement a drain region of the semiconductor devices. The drain region may be highly doped. A thickness of the drain region may lend sufficient structural stability to a die that is obtained when separating the device layer from the substrate. For example, the thickness of the drain region may be in the range of at least 2 μm to at most 200 μm or in the range of at least 10 μm to at most 100 μm or in the range of at least 20 μm to at most 50 μm. Optionally, a further sublayer of the device layer may implement a buffer region. For example, for FETs as semiconductor devices, an n-doped buffer layer may be implemented by a respective sublayer. For a diode as a semiconductor device, the n-doped buffer layer may correspond to a contact layer. For the case of a bipolar diode, an n-doped backside emitter region may be implemented by a respective sublayer. A further sublayer may implement a drift region.

The device layer may be provided using an epitaxial growth process, to obtain crystalline SiC for high charge carrier mobility. Generally, the growth rate of the epitaxial growth process may vary across the thickness of the device layer—i.e., along the vertical direction—, e.g., may vary for different sublayers.

To form the semiconductor devices, front-side processing may be implemented. Here, one or more electric contacts to electrically contact different region may be formed. For example, a source contact, a drain contact, and a gate contact may be formed for FETs as semiconductor devices.

In order to obtain a semiconductor device, in particular on a die of a certain thickness, according to reference implementations it may be required to remove large parts of the substrate, for example via grinding. The removed material may be discarded. Due to the comparably high price of SiC substrates, this may result in a comparably high unit cost per semiconductor device, at least in comparison to silicon. The costs may, for example, be significantly reduced by allowing for reuse of the substrate.

Hereinafter, techniques are described which facilitate re-using a SiC substrate multiple times. Hence, multiple sets of semiconductor devices can be formed sequentially on the SiC substrate. Each set of semiconductor devices can include an array of laterally-spaced semiconductor devices. By separating each set of the semiconductor devices from the substrate, the substrate can then be reused for forming a further set of semiconductor devices. Thereby, the unit cost per semiconductor device can be reduced by reusing the SiC substrate for multiple sets of semiconductor devices.

One limitation of SiC-based semiconductor devices is the tendency towards significant defect densities of the SiC substrate. For example, defects can spread and propagate during current conduction by the semiconductor devices. Stacking faults are an example of such defects. Such an effect is known as bipolar degradation. See, e.g., Lendenmann, H., et al. "Degradation in SiC bipolar devices: sources and consequences of electrically active dislocations in SiC." *Materials Science Forum*. Vol. 433. Trans Tech Publications, 2003. Stacking faults can result in an increased ON-state resistance Ron for transistors or an increased forward voltage of diodes. Such defects can lower the yield in manufacturing of the semiconductor devices. This again increases the unit cost per semiconductor devices. Also, the operational reliability of the semiconductor devices can be degraded.

Typically, the defect density can require countermeasures to avoid malfunctioning of the semiconductor devices. In one example, such defects may be suppressed by implementing highly-doped buffer regions between the substrate and an epitaxial layer of SiC in which the semiconductor devices are formed. This buffer region facilitates a high recombination rate of positively charged electric carriers (holes) that are injected from the front side of the die. Thereby, growth of stacking faults can be suppressed. See Savkina, N. S., et al. "Characterization of 3C—SiC/6H—SiC heterostructures grown by vacuum sublimation." *Materials Science Forum*. Vol. 433, pp. 293-296. Trans Tech Publications, 2003. Here, a porous layer of SiC is provided in between an epitaxial SiC layer and the substrate. Thereby, the density of defects in the epitaxial SiC layer may be significantly reduced if compared to the density of defects in the substrate.

Hereinafter, techniques are described which facilitate suppression of propagation of any crystallographic defects of the substrate into the device layer. Thereby, the yield in manufacturing of the semiconductor devices can be increased which, in turn, also helps to decrease the unit cost per semiconductor device. Further, a likelihood of failure of operational semiconductor devices can be decreased.

In the various examples described herein, such effects may be achieved by interfacing the substrate and the device layer by a further layer. This layer is referred to as interface layer, hereinafter.

The interface layer is supported by the substrate. For example, the interface layer may be defined adjacent to the front side of the substrate. For example, the interface layer may be defined in the substrate, adjacent to the front side. Alternatively or additionally, the interface layer may be defined on the substrate, adjacent to the front side; i.e., the interface layer may be provisioned on top of the substrate using a growth process. There may not be other layers in-between the substrate and the interface layer. For instance, in some embodiments the interface layer may not be attached to the substrate using adhesive, etc.

Lateral dimensions of the interface layer may correspond to lateral dimensions of the substrate. For example, the interface layer may laterally extend across the entire front side of the substrate, or at least across 90% of the area of the front side of the substrate.

Vertical dimensions of the interface layer, i.e., a thickness of the interface layer, may be in the range of at least 1 μm, for example at least 2 μm or for example at least 5 μm, to at most 50 μm, for example at most 25 μm or for example at most 10 μm. It is possible that the thickness of the interface layer is at most 50% of the thickness of the device layer, optionally at most 20% of the thickness of the device layer, further optionally at most 5% of the thickness of the device layer.

Vertical dimensions of the substrate may be in the range of 100 μm to 800 μm, for example in the range of 200 μm to 500 μm.

As a general rule, the thickness of the interface layer may be small if compared to the thickness of the substrate. For example, the thickness of the interface layer may not be larger than 20% or optionally 10% of the substrate.

The material of the interface layer may correspond to the material of the substrate and/or of the device layer. Typically, the substrate, the interface layer, and the device layer are made of SiC. Hereinafter, the term "made of" is to be understood within usual fabrication tolerances and does not exclude the presence of impurities and/or dopants. It is possible, but not mandatory that the interface layer is made of epitaxial SiC. In some scenarios, the atomic order of SiC may vary between the substrate, the interface layer, and the device layer. For example, it would be possible that the substrate, the interface layer, and the device layer all include SiC in crystalline form, but, e.g., according to different polytypes. It would also be possible that the substrate, the interface layer, and the device layer all include SiC in crystalline form and in the same polytype.

As a general rule, crystalline SiC—e.g., for the device layer and, optionally, the interface layer—can be provided using epitaxial growth processes in the various examples described herein. This may include using chemical vapor deposition (CVD) and/or sublimation epitaxy. For instance, a step-controlled epitaxial growth process can be employed, see, e.g.: Matsunami, Hiroyuki, and Tsunenobu Kimoto. "Step-controlled epitaxial growth of SiC: High quality homoepitaxy." Materials Science and Engineering: R: Reports 20.3 (1997): 125-166. Such a step-controlled epitaxial growth process typically relies on an off-orientation direction with respect to a crystallographic face of the substrate. For example, in the case of 4H—SiC, this crystallographic face may be the SiC(1,1,−2,0) face. Typically, in the case of 4H—SiC, the off-direction encloses an angle of 4°-5° with the SiC(1,1,−2,0) face. The crystal growth is implemented on terraces or islands of the surface of the material. Adsorbed species of the CVD are incorporated into the steps of such terraces.

The interface layer may be designed to provide various functionality. For example, the interface layer may be designed to suppress propagation of defects—such as stacking faults and/or dislocations—from the substrate into the device layer. Alternatively or additionally, the interface layer may be designed to enable separation of the substrate from the device layer to thereby facilitate reuse of the substrate in a further process of forming further semiconductor devices.

As such, a method includes providing the interface layer of SiC. The interface layer is supported by the SiC substrate. The method also includes providing the device layer of epitaxial SiC on the interface layer. The method also includes forming a plurality of semiconductor devices in the second layer. The method also includes separating the substrate from the second layer at the first layer.

There are various design options available for the interface layer, to provide such functionality. For example, the interface layer may include a plurality of cavities. The cavities may be defined within the material of the interface layer.

In the various examples described herein, different types of cavities may be relied upon. In one example, the cavities may be defined by the interface layer having a porosity. Such a porous interface layer may be obtained from electrochemical etching, for example photoelectrochemical etching. Here, it is typically not required to use epitaxial SiC. Typically, an ensemble of pores of such a porous interface layer may not exhibit a preferred direction or any large-scale order. Rather, pores of the porous layer may exhibit a statistical distribution of size and/or shape and/or orientation. It would be possible that the pores form an interconnected network. In other words, the porous layer could be a sponge-type porous layer.

In another example, the cavities may be implemented by voids. Voids typically have a tailored size and/or shape and/or orientation. For example, voids may be defined in a top-down process using well-controlled process parameters. As such, while the voids may also exhibit a distribution of size and/or shape and/or orientation, a width of such a distribution may be significantly smaller than the width of the corresponding distribution for pores of a reference porous layer. Specifically, the voids may be aligned with a preferred direction and may exhibit large-scale order.

In any case, provisioning cavities—e.g., pores and/or voids—in the interface layer can help to reduce a defect density in the device layer. Also, separation of the substrate from the device layer is supported by the reduced structural rigidity and/or stability of the interface layer induced by the cavities.

The following examples will be described hereinafter.

Example 1. A method, comprising: providing a first layer (101) of silicon carbide (e.g., of epitaxial silicon carbide) supported by a silicon carbide substrate (130); providing a second layer (102) of epitaxial silicon carbide on the first layer (101); forming a plurality of semiconductor devices (105, 105-1, 105-2, 105-3) in the second layer (102); and separating the substrate (130) from the second layer (102) at the first layer (101), wherein the first layer (101) comprises a plurality of voids (150).

Example 2. The method of example 1, wherein said providing of the first layer (101) comprises using a trench-fill process (2101) to define the plurality of voids (150).

Example 3. The method of example 2, wherein the trench-fill process (2101) comprises at least one of dry etching of lithographically-defined trenches (160), damage implantation of the trenches (160), and electrochemical etching of the trenches (160).

Example 4. The method of any one of the preceding examples, wherein said providing of the first layer (101) comprises using an epitaxial growth process.

Example 5. The method of examples 2 or 3, and of example 4, wherein the epitaxial growth process used for providing the first layer (101) is a step-controlled epitaxial growth process which uses an off-orientation direction (161) with respect to a crystallographic face of the substrate (130), wherein trenches (160) of the trench-fill process (2101)

enclose an angle (162) of at least 1° with the off-orientation direction (161), optionally of at least 5°, further optionally of at least 85°.

Example 6. The method of examples 4 or 5, wherein a growth rate of the step-controlled epitaxial growth process of the first layer (101) is in an lateral overgrowth regime (965) for enclosing voids (150) of the plurality of voids (150).

Example 7. The method of any one of the preceding examples, wherein said providing of the first layer (101) comprises using a reflow process, wherein a temperature of the reflow process is in an lateral closure regime for enclosing voids (150) of the plurality of voids (150).

Example 8. The method of any one of the preceding examples, wherein said providing of the first layer (101) comprises etching ridges (152) between adjacent voids (150) of the plurality of voids (150).

Example 9. The method of any one of the preceding examples, wherein the first layer (101) comprises a first sublayer (101-1) having a first void density (301) and further comprises a second sublayer (101-2) having a second void density (302), wherein the first sublayer (101-1) of the first layer (101) is arranged in-between the second sublayer (101-2) of the first layer (101) and the substrate (130), wherein the first void density (301) is larger than the second void density (302).

Example 10. The method of any one of the preceding examples, wherein said providing of the second layer (102) comprises using an epitaxial growth process, wherein the second layer (102) comprises a first sublayer (102-1) and a second sublayer (102-2), wherein the first sublayer (102-1) of the second layer (102) is arranged in-between the second sublayer (102-2) of the second layer (102) and the first layer (101), wherein a growth rate (312-1) of the epitaxial growth process of the first sublayer (102-1) of the second layer (102) is smaller than a growth rate (312-2) of the epitaxial growth process of the second sublayer (102-2) of the second layer (102).

Example 11. The method of any one of the preceding examples, wherein voids (150) of the plurality of voids (150) have an elongated shape, wherein longitudinal axes (151) of the voids (150) of the plurality of voids (150) are aligned with each other.

Example 12. The method of any one of the preceding examples, wherein voids (150) of the plurality of voids (150) are arranged in a lateral pattern defined in the first layer (101).

Example 13. The method of any one of the preceding examples, wherein the first layer (101) comprises dopants defining a resistivity of the first layer (101), which resistivity of the first layer (101) is smaller than a resistivity of the substrate (130).

Example 14. The method of any one of the preceding examples, further comprising: planarizing the first layer (101) prior to said providing of the second layer (102).

Example 15. The method of any one of the preceding examples, wherein the first layer (101) comprises a light-absorbing material, wherein said separating of the substrate (130) from the second layer (102) comprises damaging the first layer (101) using laser light (250) absorbed by the light-absorbing material.

Example 16. The method of example 15, wherein the light-absorbing material comprises at least one of dopants and at least one carbon layer obtained from a tempering process used for providing the first layer (101).

Example 17. The method of any one of the preceding examples, wherein said separating of the substrate (130) from the second layer (102) comprises at least one of: injecting a fluid into the plurality of voids (150) and cooling the fluid below its freezing point; rapid pressure changes; and micro-electro-discharge-machining at the first layer (101).

Example 18. The method of any one of the preceding examples, further comprising: providing a protection material at vertical edges etched into the second layer (102).

Example 19. The method of any one of the preceding examples, further comprising: vertically dicing the second layer (102) to singulate the semiconductor devices (105, 105-1, 105-2, 105-3) of the plurality of semiconductor devices (105, 105-1, 105-2, 105-3), wherein the second layer (102) is diced prior to said separating of the substrate (130) from the second layer (102).

Example 20. The method of any one of the preceding examples, further comprising: depositing a backside metallization layer on a remainder of the first layer (101) after said separating of the substrate (130) from the second layer (102).

Example 21. The method of any one of the preceding examples, wherein the first layer (101) is provided at a first growth rate (311-1, 311-2), wherein the second layer (102) is provided at a second growth rate (312-1, 312-2), wherein the first growth rate is smaller than the second growth rate.

Example 22. A method, comprising: providing a first layer (101) of porous silicon carbide; providing a second layer (102) of epitaxial silicon carbide on the first layer (101); forming a plurality of semiconductor devices (105, 105-1, 105-2, 105-3) in the second layer (102); and separating the substrate (130) from the second layer (102) at the first layer (101).

Example 23. The method of any one of the preceding examples, wherein a thickness (102A) of the second layer (102) is at least 20 µm, optionally at least 50 µm; or wherein a thickness (102A) of the second layer (102) is at most 30 µm, optionally at most 20 µm.

Example 24. The method of any one of the preceding examples, further comprising: defining a drift region of the plurality of semiconductor devices (105, 105-1, 105-2, 105-3) in the second layer (102); and defining a drain region or a backside emitter region of the plurality of semiconductor devices (105, 105-1, 105-2, 105-3) in the second layer (102). The thickness of the drain region or the backside emitter region may or may not be larger than the thickness of the drift region.

Example 25. The method of any one of the preceding examples, wherein said providing of the first layer (101) comprises using an electrochemical etching process.

Example 26. A wafer, comprising: a silicon carbide substrate (130); and a first layer (101) of silicon carbide supported by the silicon carbide substrate (130), wherein the first layer (101) comprises a plurality of voids (150).

Example 27. The wafer according to example 26, further comprising: a second layer (102) of epitaxial Silicon carbide comprising a drift region of a plurality of semiconductor devices and further comprising a drain region or a backside emitter region of the plurality of semiconductor devices. The thickness of the drain region or the backside emitter region may or may not be larger than the thickness of the drift region.

Example 28. The wafer according to example 26 or example 27, wherein a thickness (102A) of the second layer (102) is at least 20 µm, optionally at least 50 µm; or wherein a thickness (102A) of the second layer (102) is at most 30 µm, optionally at most 20 µm.

The examples described above can be combined with each other, to yield further examples. For example, it would be possible to apply techniques for separating the second layer from the substrate described in connection with the first layer including voids also for a scenario in which the first layer includes pores. Further techniques described with respect to methods above can be applied to examples relating to the wafer. For example, the wafer can be manufactured using such methods.

FIG. 1 is a flowchart of a method according to various examples. The method according to FIG. 1 corresponds to an example process according to the techniques described herein.

At block 1001, a first layer is provided. The first layer is supported by a substrate. The first layer may be provided in the substrate or on the substrate. The substrate is provided by a wafer.

The first layer corresponds to the interface layer described above. For example, the interface layer can include a plurality of cavities, e.g., implemented by pores or voids.

In a scenario in which the interface layer includes a plurality of voids, the interface layer can be provided using an epitaxial growth process. As such, the interface layer can be made of epitaxial SiC. Another option would be to define the interface layer in the substrate, also made of epitaxial SiC; in such a scenario, no dedicated epitaxial growth process may be required to provide the interface layer.

In a further scenario, in which the interface layer comprises pores, the interface layer can be provided using electrochemical etching. In such an example, the electrochemical solution, based on aqueous hydrofluoric acid (HF), may contain some additives, e.g. surfactants, ethanol, isopropanol. The concentration of HF is typically in the range below 50% by volume. The ratio between aqueous HF and additive may be 3:1, 2:1, 1:2, 1:1, 3:1, 1:4 (measured by weight). Depending on the voltage conditions for the anodization process, voltages below 100V can be used or even lower (below 10V), depending on if the process is carried out under additional UV illumination or not. The current density can set the pore density (sometimes also referred to as porosity) of the porous layer. For example, a typical current density is the range of 10 $\mu A/cm^2$-100 $mA/cm^2$. The pore density is a measure of the empty spaces in the material of the interface layer. Typically, it is defined as the fraction of the volume of empty material over the total volume and can hence vary in between 0% and 100%.

After etching, rinsing and drying can be performed.

As a general rule, it would be possible that the interface layer is made of a 4H—SiC polytype. In particular in such a configuration, it would be possible that the electrochemical etching is performed when the (0001) Silicon face is outward facing (if compared to the (000$\bar{1}$) Carbon face). Another option would be that the interface layer is made of a 6H—SiC polytype.

Next, at block 1002, a second layer is provided. The second layer is provided on the interface layer. The second corresponds to the device layer described above.

Block 1002 can include an epitaxial growth process for depositing a drain region—e.g., an n-doped drain region —, a buffer region—e.g., an n-doped buffer region—and/or a backside emitter region, onto the interface layer. For devices with a blocking capability below 3.5 kV, the thickness of the drain region or backside emitter region may be larger than the thickness of the drift region.

Block 1002 can include an epitaxial growth process for depositing a drift region.

Block 1002 can include an hydrogen-pre-treatment, to facilitate a defect-free growth process. See, e.g., Feenstra, Randall M., and Colin EC Wood. Porous SiC and gallium nitride: epitaxy, catalysis, and biotechnology applications. John Wiley & Sons, 2008.

At block 1003, a plurality of semiconductor devices is formed in the device layer. This can include frontside processing to define body regions, source regions, emitter regions and/or electrical contacts of the semiconductor devices.

At block 1004, the substrate is separated from the device layer, at the interface layer. This can include supporting the device layer on a carrier, prior to exerting a force to trigger the separation.

Block 1004 yields one or more dies or chips which include the plurality of semiconductor devices. Block 1004 also yields a remainder of the substrate. For example, any residual of the interface layer on the substrate may be removed, for example by grinding or polishing. For example, ultra-rapid polishing may be employed.

At optional block 1005, a backside metallization layer is deposited onto the backside of the one or more dies obtained from block 1004. Typically, the backside metallization layer can be deposited on a remainder of the interface layer that is attached to the device layer, after said separating.

Block 1005 is optional. In some scenarios, instead of executing block 1005, it would be possible to provide dopants in the interface layer, at block 1001; thereby, the resistivity of the interface layer can be smaller than the resistivity of the substrate. Then, a remainder of the interface layer which is adjacent to the device layer can exhibit a significant conductivity which facilitates an Ohmic backside contact. The increased roughness of the backside provided by the remaining interface layer can contribute to a reduced contact resistance.

The method of FIG. 1 facilitates suppression of propagation of defects from the substrate to the device layer. This corresponds to an improvement of the crystallographic quality of the device layer if compared to the crystallographic quality of the substrate; this facilitates employing a substrate having a reasonable defect density. Typically, SiC substrates having a particularly low defect density are more expensive if compared to SiC substrates having a comparably high defect density. In the techniques described herein, it is possible to improve the defect density by means of the interface layer; therefore, it may not be required to rely on substrates of particularly high quality. The cavities in the interface layer stop or reduce propagation of extended stacking faults and other defects.

Illustrated by the dashed arrow in FIG. 1 is the possibility to reuse the substrate. Specifically, the remainder of the substrate obtained from executing block 1004 can be used as an input for a further iteration of blocks 1001-1005. Depending on the level of material abrasion per iteration, a large count of iterations are supported by re-using a single substrate, potentially an arbitrary number. In some examples, to compensate for the material abrasion, it would be possible to provide a further layer of epitaxial SiC after separating the substrate at block 1004. Thereby, the initial thickness of the substrate can be preserved.

Further details of the process defined by the method of FIG. 1 are described in connection with the schematic illustration of FIG. 2.

Figure 2:
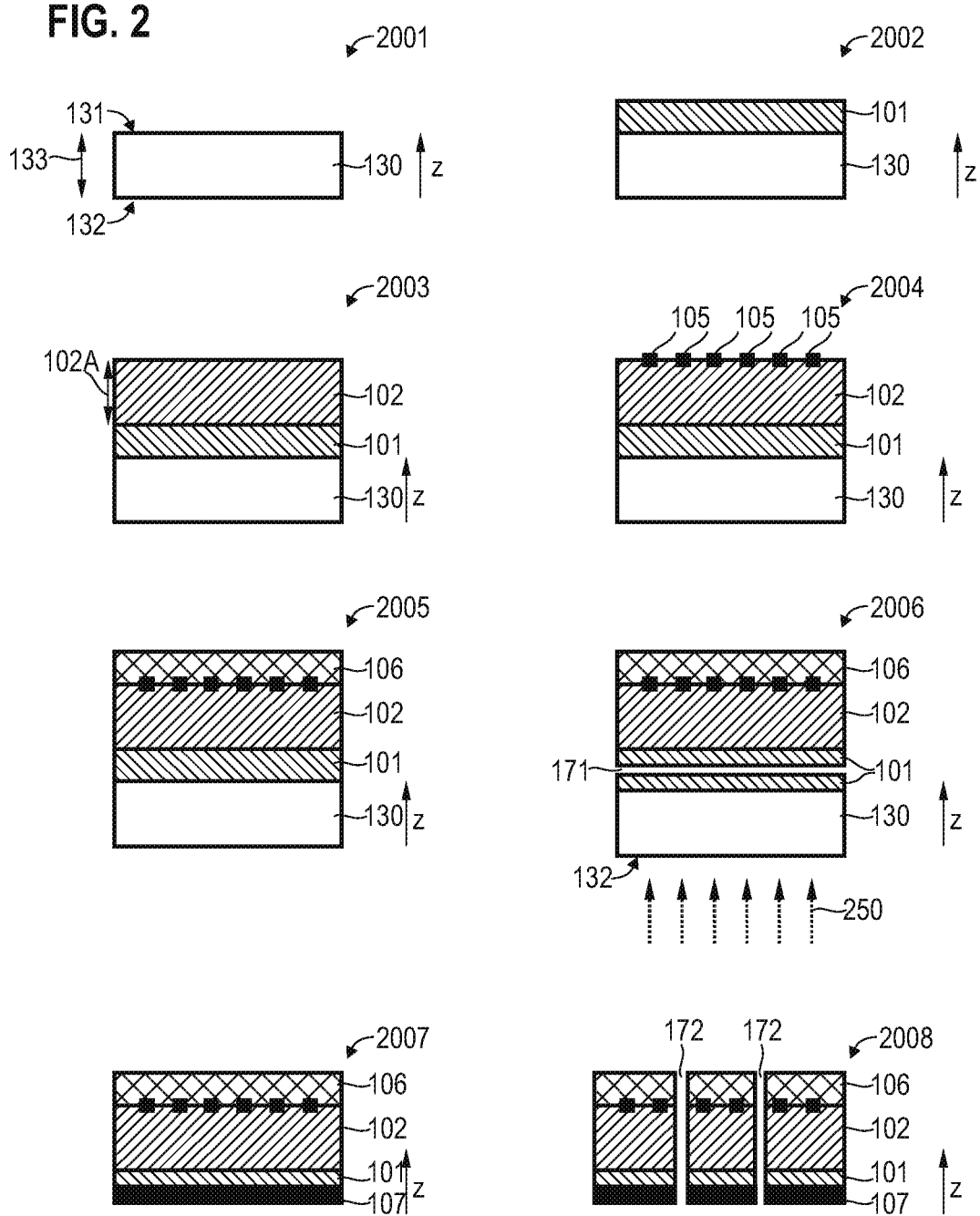
FIG. 2 schematically illustrates multiple process steps of forming semiconductor devices in SiC according to various examples.

FIG. 2 illustrates aspects with respect to processing SiC according to various examples.

At process step 2001, the substrate 130 is provided. Illustrated in FIG. 2 is a vertical direction z along which the thickness 133 of the substrate is defined. Also illustrated is a front side 131 and the back side 132 of the substrate 130.

At process step 2002, the interface layer 101 is provided on the substrate 130. The interface layer 101 is adjacent to the front side 131. The interface layer 101 includes cavities. For example, the interface layer 101 may be a porous layer or may include voids.

The interface layer 101 is provided using a growth process, e.g., an epitaxial growth process. Typically, the thickness of the interface layer may be in the range of at least 1 μm to at most 50 μm or in the range of at least 2 μm to at most 10 μm.

The Silicon face may be upward facing after block 2002.

It would be possible to planarize the interface layer 101 after using the growth process and prior to process step 2003.

At process step 2003, the device layer 102 is provided on the interface layer 101. Typically, the thickness 102A of the device layer 102 may be at least 10 μm, optionally at least 50 μm or at least 100 μm or at least 150 μm.

In other examples, at process step 2003, a particularly small thickness of the device layer 102 may be provided. For example, the thickness 102A of the device layer 102 can be at most 30 μm, or at most 20 μm.

As a general rule, there may be a tendency to dimension a thickness of the device layer 102 as small as possible, but as large as required. Various properties of the semiconductor devices may be dependent on the thickness of the device layer 102 and, in particular, a trade-off situation may occur. (i) A smaller thickness may provide better thermal properties, e.g., heat may dissipate to a carrier or heat-sink more efficiently; (ii) A smaller thickness can provide for faster and cost-efficient processing; (iii) A larger thickness can increase the breakthrough voltage of, e.g., transistors implemented by the semiconductor devices; (iv) A larger thickness can provide increased structural stability to the resulting chips and when separating the device layer 102 from the substrate 130; (v) A larger thickness can result in a higher Ron.

The device layer 102 is provided using an epitaxial growth process. It is possible that the growth rate of the growth process for providing the device layer 102 is larger than the growth rate of the growth process for providing the interface layer 101. This may facilitate large thicknesses 2003A of the device layer 102.

For example, large growth rates of the growth process for providing the device layer 102 may be facilitated by a high-quality epitaxial growth process for providing the interface layer 101. Planarization of the interface layer 101 may further help to support large growth rates for providing the device layer 102. Options for planarizing the surface include: chemical-mechanical planarization; polishing; and damage etching. All this facilitates a morphology of the device layer 102 that supports low defect densities and high-yield of the semiconductor devices 105 formed at process step 2004.

Providing the device layer 102 may include defining a drift region for semiconductor devices 105 formed at process step 2004.

At process step 2004, semiconductor devices 105 are formed in the device layer 102. This includes forming electrical contacts, etc.

At process step 2005, a front side carrier 106 is attached to the device layer 102. In the example of FIG. 2, the front side carrier 106 remains attached to the device layer 102; in other examples (not shown in FIG. 2), the front side carrier 106 may be removed, e.g., at process step 2007.

At process step 2006, the device layer 102 is separated from the substrate 130 at the interface layer 101. A fracture 171 is illustrated in FIG. 2.

As a general rule, there are various options available to causing the fracture 171 for separating the substrate 130.

In a first option, a backside laser process may be employed, as illustrated in FIG. 2. Here, laser light 250 is irradiated onto the backside 132 of the substrate 130, which causes damage to the interface layer 101 due to light absorption and heating. This is facilitated by the transparency of the SiC of the substrate 130 with respect to the laser light 250. The damage to the interface layer 101 further reduces the structural rigidity of the interface layer 101 such that eventually the fracture 171 results.

To further enhance such damage, it would be possible that the interface layer 101 includes light absorbing material. Then, the substrate 130 can be separated from the device layer 102 by using the laser light 250 which is absorbed by the light-absorbing material. Dopants can be used as light-absorbing material. Also, one or more carbon layers—e.g., graphene—may be used as light-absorbing material. For example, such carbon atoms could be obtained from a temper process applied to the interface layer 101 at process step 2002. If light absorbing material is provisioned in the interface layer 101, it may not be required to focus the laser light 250 such that the highest intensity is observed at the interface layer 101. Rather, absorption at the interface layer 101 can be increased by means of the light absorbing material, instead of a spatially varying intensity of the laser light 250. This reduces a complexity of process step 2006.

In a second option, to facilitate the fracture 171, i.e., to trigger the separation of the substrate 130 from the device layer 102, at least parts of a cold-split process may be used, see, e.g., Swoboda, Marko, et al. "Laser assisted SiC wafering using COLD SPLIT." *Materials Science Forum*. Vol. 897. Trans Tech Publications, 2017. Here, a layer including a polymer or polymers can be deposited, e.g., on the front side of the device layer 102. The polymer may have a different thermal expansion coefficient than the substrate 130. Then, when cooling, a length and/or volume change of the polymer induces a mechanical stress which leads to the fracture 171. Generally, due to the reduced structural rigidity of the interface layer 101, the mechanical stress induced by such a length change of the polymer layer can even be sufficient to lead to separation; then, it may not be required to additionally employ the backside laser process. Thus, the backside laser process is generally optional.

In a third option, separating the substrate 130 can, alternatively or additionally, include injecting a fluid into the voids of the interface layer 101. Then, the fluid can be cooled below its freezing point. Expansion of the fluid at the transition to solid-state can also induce mechanical stress which leads to the fracture 171. For example, water in fluid state or gas state can be used.

In a fourth option, separating the substrate 130 can, alternatively or additionally, include water jet treatment.

In a fifth option, separating the substrate 130 can, alternatively or additionally, include micro-electro-discharge-machining (μEDM) in the interface layer 101.

In a sixth option, separating the substrate 130 can, alternatively or additionally, include applying rapid pressure changes to induce stress.

At process step 2007, a backside metallization layer 107 is provided at the backside 132, on a remainder of the interface layer 101. Again, this is optional. Alternatively, the interface layer may be removed.

At process step 2008, vertical dicing of the device layer 102 to singulate the semiconductor devices 105 is implemented. Respective KERF structures can be used to define the dicing lines 172.

In the scenario of FIG. 2, the dicing of process step 2008 is after the separation of the substrate 130 which takes place at process step 2006. In other examples, it would be possible that singulating the semiconductor devices 105 by dicing is executed prior to separating the substrate 130 from the device layer 102, e.g., prior to process step 2006 and after process step 2005.

Figure 3:
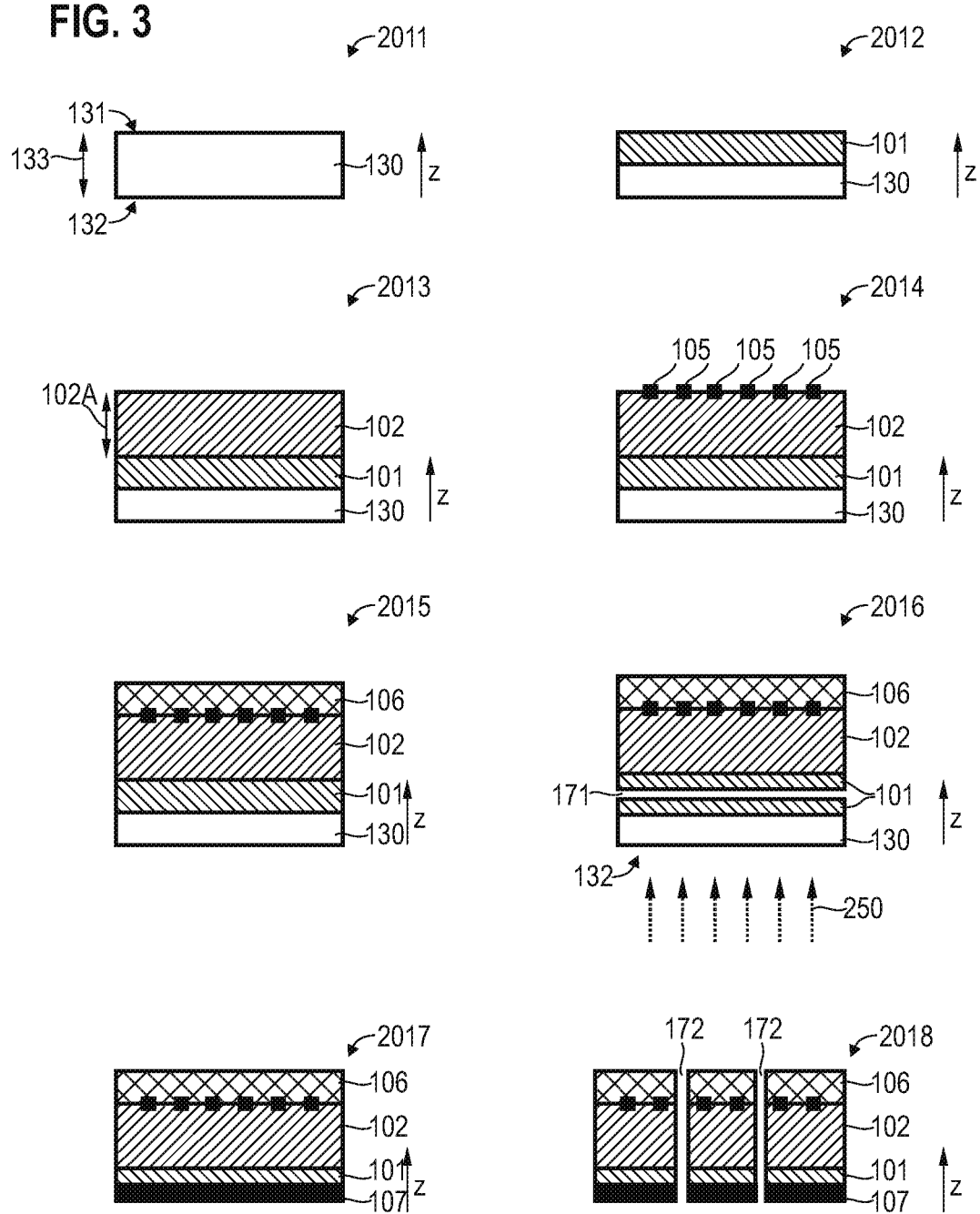
FIG. 3 schematically illustrates multiple process steps of forming semiconductor devices in SiC according to various examples.

FIG. 3 illustrates aspects with respect to processing SiC according to various examples.

The processing of FIG. 3 generally corresponds to the processing of FIG. 2. For example, process step 2011 corresponds to process step 2001. Process step 2013 corresponds to process step 2003. Process step 2014 corresponds to process step 2004. Process step 2015 corresponds to process step 2005. Process step 2016 corresponds to process step 2006. Process step 2017 corresponds to process step 2007. Process step 2018 corresponds to process step 2008.

In process step 2012, the interface layer 101—different to process step 2002—is not provided as an epitaxial layer on the substrate 130 using a growth process, but rather provided in the substrate 130. For example, the cavities can be defined in the top layer of the substrate 130 by appropriately structuring the top layer of the substrate 130.

Figure 4:
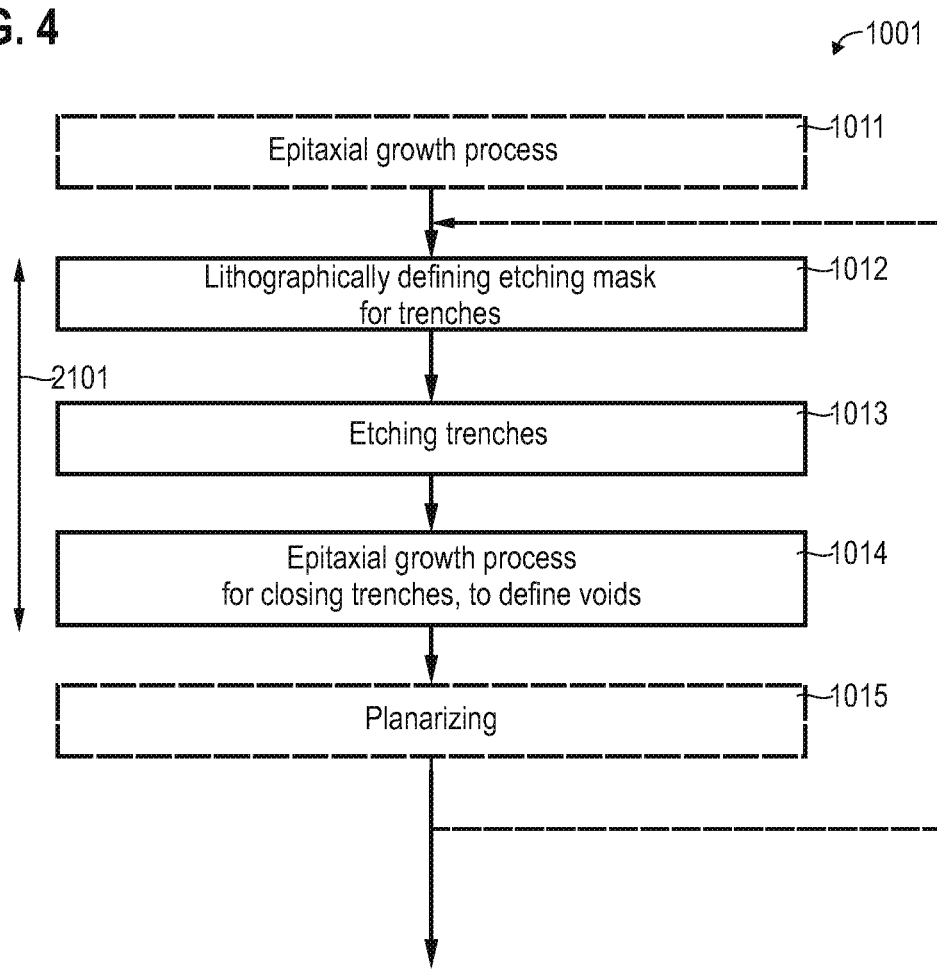
FIG. 4 is a flowchart of a method according to various examples, wherein the method includes a trench fill process.

FIG. 4 is a flowchart of a method according to various examples. For example, the method of FIG. 4 may be employed in connection with block 1001 of FIG. 1 to provide the interface layer 101.

Specifically, FIG. 4 illustrates aspects with respect to defining a plurality of voids in the interface layer 101.

The method starts with block 1011. Block 1011 is an optional block. In block 1011, an epitaxial growth process is performed, specifically a step-controlled epitaxial growth process. Crystalline SiC is deposited on the substrate (cf. process step 2002 of FIG. 2). In other implementations, the interface layer may be defined in the substrate such that it is not necessary to deposit any additional material on top of the substrate (cf. process step 2012 of FIG. 3).

Figure 5:
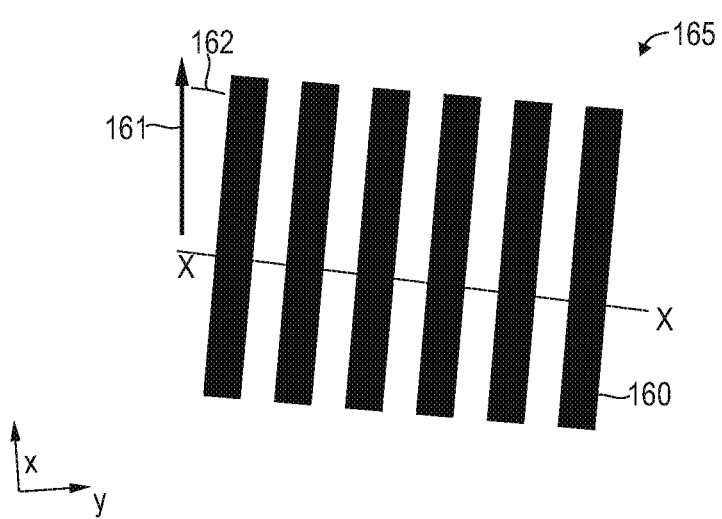
FIG. 5 schematically illustrates an etching mask defining trenches of the trench fill process according to various examples.

Next, at block 1012, an etching mask is lithographically defined, e.g., using a resist and exposure thereof. The etching mask defines the shape of trenches. An example etching mask 165 as illustrated in FIG. 5. The longitudinal shaped trenches 160 are illustrated. FIG. 5 is a top view; the lateral plane of the wafer corresponds to the drawing plane.

Specifically, the trenches 160 enclose an angle 162 with the off-orientation direction 161 of the step-controlled epitaxial growth process of block 1011. For example, the angle 162 may be at least 1°, optionally at least 5°, further optionally at least 85°. For example, the angle may be 90°±5°.

Again referring to FIG. 4: next, at block 1013, the trenches 160 are etched. Here, it is possible to use one or more of dry etching, damage implantation, and electrochemical etching to define the trenches 160. Material is locally removed where the SiC is not protected by the masking material 165 (for example, the photoresist and/or the hard mask).

At block 1014, again, an epitaxial growth process is used to deposit SiC. Prior to depositing the material, the etching mask 165 is removed. Using the epitaxial growth process, the trenches are filled; which is why blocks 1012-1014 are sometimes referred to as a trench-fill process 2101. As will be appreciated, providing the interface layer 101 thus may include using the trench-fill process 2101.

In some examples it would be possible to implement multiple iterations of the trench-fill process 2101, as illustrated by the dashed arrow in FIG. 4. Thereby, it is possible to provide the interface layer 101 with two or more sublayers.

Figure 6:
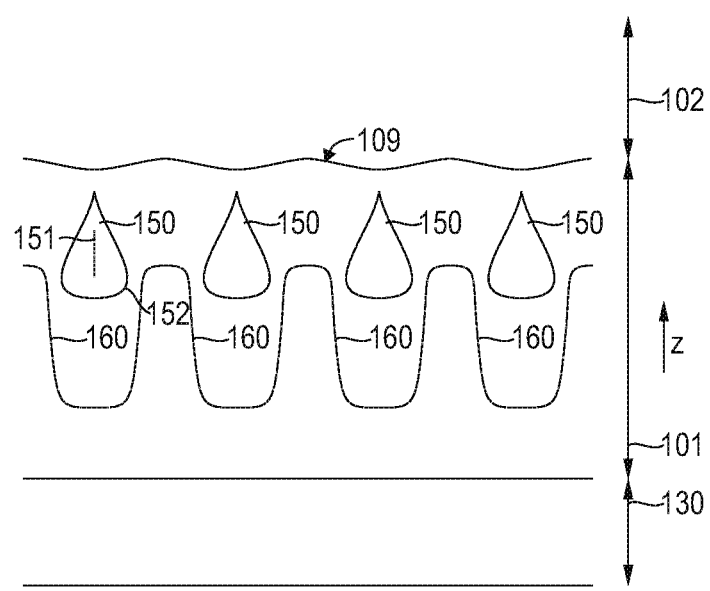
FIG. 6 schematically illustrates trenches of the trench fill process and further schematically illustrates voids defined by the trenches according to various examples.

Using the trench-fill process 2101 facilitates defining voids in the interface layer 101. FIG. 6 illustrates details with respect to the voids 150.

FIG. 6 illustrates aspects with respect to the interface layer 101 including a plurality of voids 150. FIG. 6 is a cross-sectional view along the vertical direction z and the line X-X of FIG. 5. Illustrated in FIG. 6 are the trenches 160 defined by the trench-fill process 2101.

In FIG. 6, the voids 150 are associated with the trenches 160. The voids 150 result from overgrowth of the trenches 160, when depositing material at block 1014 of FIG. 4. Hence, the voids 150 are provided in a top-down process and exhibit a preferred direction. For example, as illustrated in FIG. 6, the longitudinal axes 151 of the voids 150 are aligned with each other. This alignment is induced by the geometrical shape and arrangement of the etching mask 165. Likewise, the etching mask 165 induces an arrangement of the voids 150 in a lateral pattern, along the trenches 160. The voids 150 have an elongated shape along the z direction. The voids 150 have a droplet shape. As such, the voids 150 differ from—typically spherical—pores of a porous layer.

As will be appreciated, in the example FIG. 6, the voids 150 do not form an inter-connected network (sponge-type cavities). In some examples, it may be desirable to define the voids 150 such that they form an inter-connected network. For example, where adjacent voids are connected with each other and/or for the case that the voids extend along the whole wafer in the direction vertical to the z-direction so that they reach the edge of the wafer, it is possible to inject a fluid for facilitating the separation of the substrate 130 by cooling the fluid below its freezing point. There are various options available for defining the voids 150 such that they form an interconnected network. According to an example option, it would be possible to suspend the growth process of block 1014 in FIG. 4 and—while suspending—etch ridges 152 of the still-open voids 150. This etching may include oxidizing the material and subsequent treatment of hydrofluoric acid of the oxidized material.

In some examples, such etching of the ridges 152 may not be used to form the inter-connected network; but rather to enlarge the volume of individual voids 150, to further reduce the structural stability of the interface layer 101. This further facilitates separating the device layer 102 from the substrate 130 at the interface layer 101.

As a general rule, various options are available to facilitate the formation of the voids 150 when depositing material at block 1014 of FIG. 4. These options may be employed alone or in combination with each other.

A first option for facilitating the formation of the voids 150 includes appropriate selection of the angle 162 (cf. FIG. 5). Typically, dimensioning of the angle 162 in the range of 4° to 90° can help to facilitate enclosure of the voids.

A second option for facilitating the formation of the voids 150 includes using a reflow process. Here, lateral redistribution of the deposited SiC material encloses the voids 150. The growth process may be interrupted for such redistribution. Process parameters which facilitate the redistribution comprise at least one of: high temperatures, low pressure, suitable gas atmosphere, e.g., with hydrogen. The temperature can be set such that it is in a lateral closure regime for enclosing the voids 150.

In a third option for facilitating the formation of the voids, process parameters of the growth process can be set within a lateral overgrowth regime. This is illustrated in connection with FIG. 7.

Figure 7:
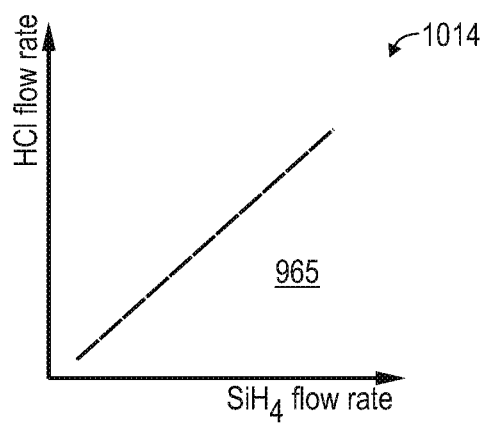
FIG. 7 schematically illustrates a lateral overgrowth regime of the trench fill process according to various examples.

FIG. 7 illustrates aspects with respect to process parameters of the epitaxial growth process of block 1014. The epitaxial growth process is a CVD process including certain flow rates of reactants, in the scenario FIG. 7 hydrochloric acid or hydrogen chloride (HCl), vertical axis, and Silane (SiH4), horizontal axis. As indicated in FIG. 7, a typical regime 965 for overgrowth—to define the voids 150—relies on a comparably large Silane flow rate and a comparably small HCl flow rate. This typically results in a small growth rate of the material deposition. Generally, the growth rate of the epitaxial growth process of block 1014 can be set such that it is in a lateral overgrowth regime 965 for enclosing the voids 150. See, e.g., Ji, Shiyang, et al. "An empirical growth window concerning the input ratio of HCl/SiH4 gases in filling 4H—SiC trench by CVD." Applied Physics Express 10.5 (2017): 055505.

Figure 8:
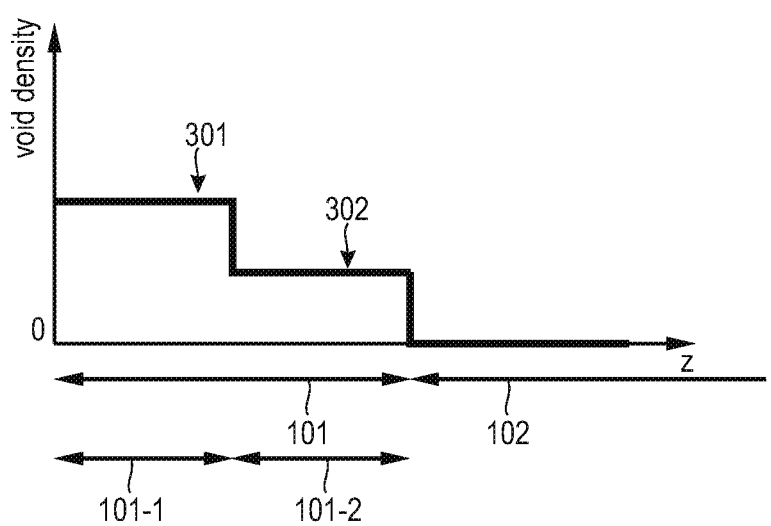
FIG. 8 schematically illustrates a void density in multiple layers according to various examples.

FIG. 8 illustrates aspects with respect to the void density as a function of the vertical position. In the scenario of FIG. 8, the interface layer 101 includes two sublayers 101-1, 101-2 (e.g., obtained from multiple iterations of the trench-fill process, cf. FIG. 4, dashed arrow). The sublayer 101-1 is adjacent to the substrate 130 and the sublayer 101-2 is adjacent to the device layer 102.

The void density can generally correspond to the ratio between (i) the volume in which the SiC material is not present in the interface layer, i.e., due to the voids, and (ii) the total volume of the interface layer. Another measure associated with the void density is the ratio between (i) the volume in which the SiC material is present in the interface layer, and (ii) the total volume of the interface layer.

For example, in various examples described herein the ratio between (i) the volume in which the SiC material is present in the interface layer, and (ii) the total volume of the interface layer may be in the range of 10% to 90%, or optionally in the range of 30% to 70%.

As illustrated, the sublayer 101-1 has a higher void density 301 if compared to the void density 302 of the sublayer 101-2.

On a general level, there may be a tendency to decrease the void density 301, 302 for increasing distances along the vertical Z-direction to the substrate 130. Thereby, the seed condition for epitaxial growth of the device layer 102 can be improved. Specifically, the morphology can be improved.

Different void densities 301, 302 can be achieved, e.g., by varying the lateral pitch between adjacent trenches 160 and/or by varying the lateral geometrical filling factor of the trenches 160. The void densities 301, 302 may be varied by changing the growth rate of the epitaxial growth process used for filling the trenches 160. Details with respect to the growth rate are described in FIG. 9.

Figure 9:
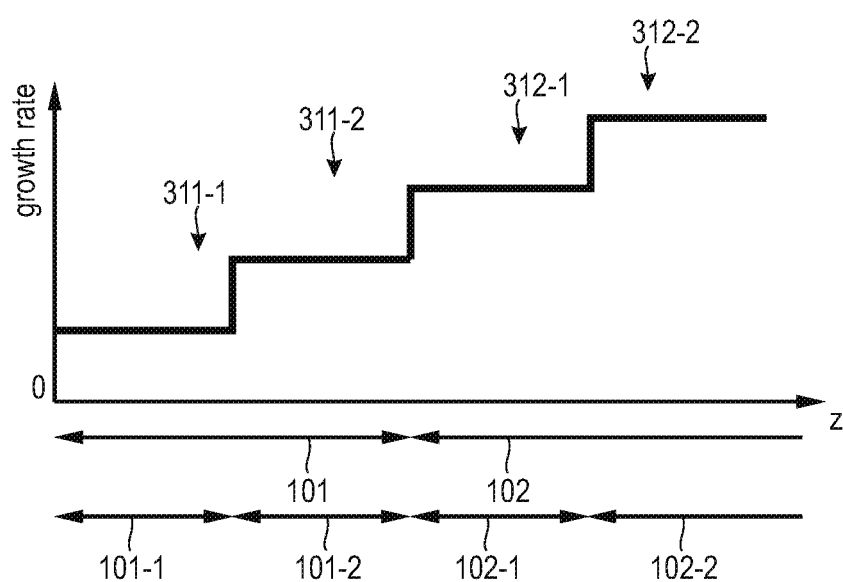
FIG. 9 schematically illustrates a growth rate of epitaxial growth according to various examples.

FIG. 9 illustrates aspects with respect to the growth rate as a function of the vertical position.

In FIG. 9, the interface layer 101 includes sublayers 101-1, 101-2. The device layer 102 includes sublayers 102-1, 102-2.

Illustrated in FIG. 9, the growth rate 311-1, 311-2, 312-1, 312-2 is increased for increasing distances to the substrate 130, along the vertical Z-direction. The increasing growth rate, in the scenario of FIG. 9, correlates with the sublayers 101-1, 101-2, 102-1, 102-2.

As a general tendency the growth rate may increase for increasing distances to the substrate 130 along the vertical Z-direction, e.g., within the interface layer 101 and/or within the device layer 102. This helps to avoid propagation of a disturbed surface morphology due to the voids 150 in the interface layer 101. This facilitates high-quality semiconductor devices 105.

As will be appreciated, the average growth rate 312-1, 312-2 of the device layer 102 is larger than the average growth rate 311-1, 311-2 of the interface layer 101. This helps to reduce the processing time, because, typically, a thickness of the device layer 102 is significantly larger than a thickness of the interface layer 101.

Figure 10:
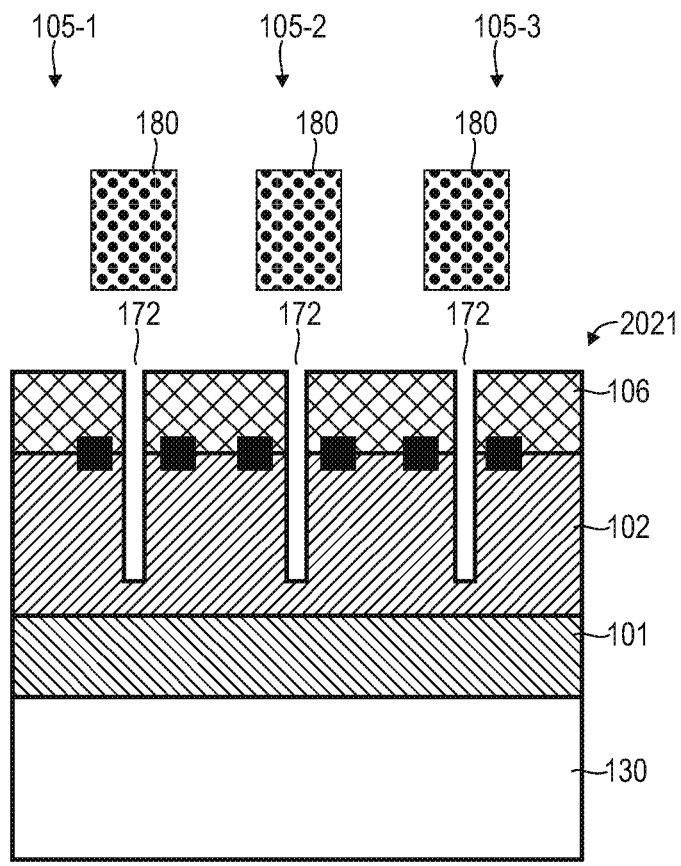
FIG. 10 schematically illustrates providing protection material at vertical edges of a wafer when singulating semiconductor devices according to various examples.
Figure 11:
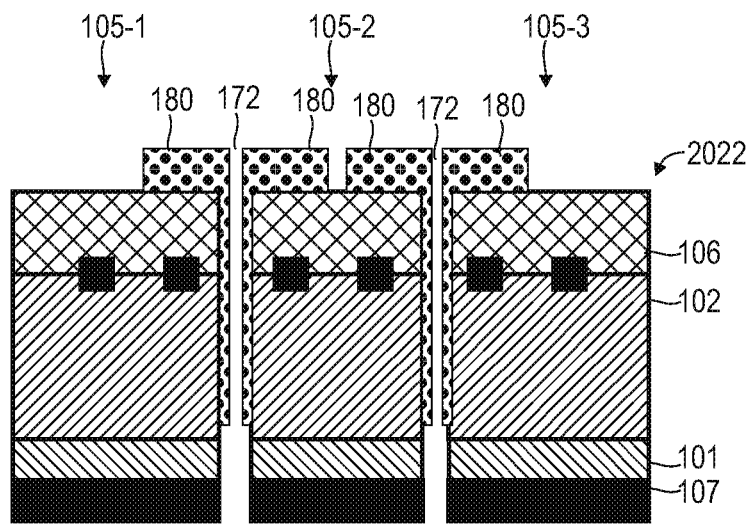
FIG. 11 schematically illustrates providing protection material at vertical edges of a wafer when singulating semiconductor devices according to various examples.

FIGS. 10 and 11 illustrate aspects with respect to singulating the semiconductor devices 105-1-105-3. Specifically, FIGS. 10 and 11 illustrate aspects with respect to protecting the semiconductor devices 105-1-105-3.

Here, edge regions 172 are etched. Then, protection material 180—e.g., glass, epoxy, or another oxide—is pressed into the edge regions 172, to cover respective vertical edges of the edge regions 172. Then, dicing for singulating the semiconductor devices 105-1-105-3 from each other is implemented along the edge regions 172. Edge passivation/edge protection is thereby provided.

Formation of the semiconductor devices 105, 105-1-105-3 can be varied in the various examples described herein. For example, the so-called "high dynamic ruggedness" (HDR) concept may be implemented that improves the turn-off ruggedness of the devices by reducing the free charge carrier density of the devices in the area of the junction termination in the on-state of the devices. Here, small regions along a later-defined dicing edge can be locally oxidized. Then, epitaxial lateral overgrowth can be applied to these locally oxidized regions. The regions, on the one side, should be sufficiently small to facilitate defect-free epitaxial lateral overgrowth; on the other side, the distance between adjacent regions should be sufficiently small such that injection of free charge carriers from the backside of the die is effectively suppressed.

A further possible modification to the formation of the semiconductor devices includes 105, 105-1-105-3 defining cavities—e.g., pores and/or voids—in the device layer 102. This is illustrated with respect to FIG. 12.

Figure 12:
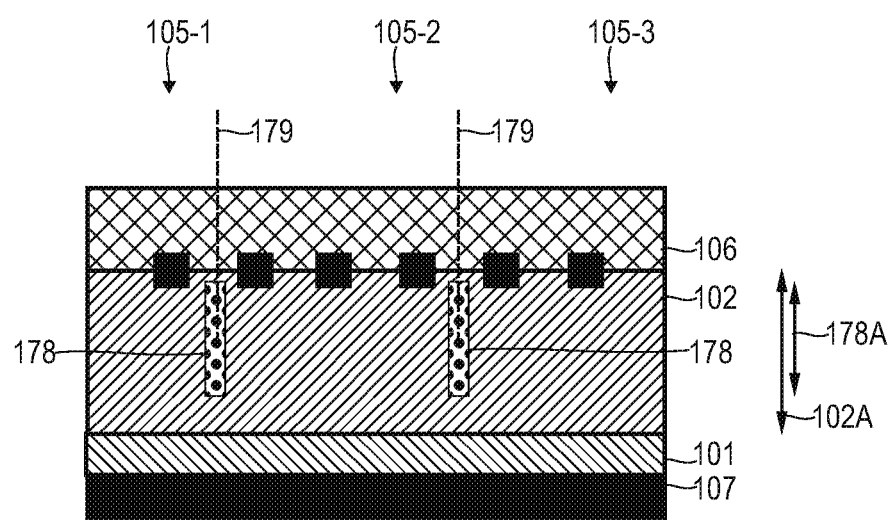
FIG. 12 schematically illustrates singulating semiconductor devices according to various examples.

FIG. 12 schematically illustrates aspects with respects to defining cavities in the device layer 102. For example, pores can be defined in laterally-confined regions 178 of the device layer 102, e.g., using electrochemical etching. These regions 178 may be aligned with KERFs 179, along which dicing is implemented to singulate the semiconductor devices 105-1 to 105-3. For example, a vertical thickness 178A of these regions 178 may be larger than the thickness of the device layer 102 (not illustrated in FIG. 12). In other examples (cf. FIG. 12), the vertical thickness 178A of these regions is smaller than the thickness 102A of the device layer 102, to, thereby, provide mechanical stabilization. It is optionally possible to deposit epitaxial growth layers of SiC after defining the cavities in the regions 178 (cf. FIG. 12, where the regions 178 do not fully extend to the front side of the device layer 102). The cavities in the regions 178 facilitate singulating the semiconductor devices 105-1-105-3 along the KERFs 179, e.g., by exerting appropriate mechanical stress. It may not be required to implement dicing. An edge quality can be increased.

FIG. 13 schematically illustrates aspects with respect to the interface layer 102 comprising porous SiC. FIG. 13 is a cross-sectional view of the interface layer 102 perpendicular to the z-direction, i.e., in the xy-plane. FIG. 13 illustrates pores 601 at different z-Positions (z1 and z2), the z-positions being offset by a distance that is smaller than the average pore size 602. (Note that in FIG. 13 not all of the pores 601 are labelled, for sake of simplicity).

As illustrated in FIG. 13, the pores 601 form an interconnected network (sponge-type pores). This means that, on average, a number of inter-connected pores 601 is significantly larger than 1, e.g., larger than 10 or larger than 100. Channels are formed in-between neighboring pores 601.

The pores 601 can have e.g., on average, a spherical shape, i.e., have an average aspect ratio of 1. Some individual pores of the ensemble of pores 601 may have an aspect ratio that deviates from 1, i.e., their length along x-direction is different from their length along y-direction (this aspect ratio is sometimes also referred to as elongation or eccentricity). That means the pores can have a longer extent in the vertical direction than in lateral direction. The semiconductor structures between the pores can have e.g. a stalactite-like structure.

FIG. 14 schematically illustrates aspects with respect to the interface layer 102 comprising porous SiC. The example of FIG. 14 generally corresponds to the example of FIG. 13. However, in the example of FIG. 14, the pore density is reduced if compared to the scenario of FIG. 13. Also, the average pore size 602 is smaller in the example of FIG. 14 if compared to the example of FIG. 13.

The pore density can generally correspond to the ratio between (i) the volume in which the SiC material is not present in the interface layer, i.e., due to the pores, and (ii) the total volume of the interface layer. Another measure associated with the void density is the ratio between (i) the volume in which the SiC material is present in the interface layer, and (ii) the total volume of the interface layer.

For example, in various examples described herein the ratio between (i) the volume in which the SiC material is present in the interface layer, and (ii) the total volume of the interface layer may be in the range of 10% to 90%, or optionally in the range of 30% to 70%.

In FIG. 14, the pore density and pore size are configured such that an inter-connected network of pores 601 is not formed.

It is possible to tailor such and other structural properties of the pores 601 using an appropriate process for preparing the porous interface layer 102. For example, the size and/or density of the pores 601 can be adjusted by adjusting a current density of electrochemical etching. In some examples, this is used to prepare multiple sublayers of the interface layer 102 having different pore densities and/or pore sizes. A corresponding scenario is illustrated in FIG. 15.

Figure 15:
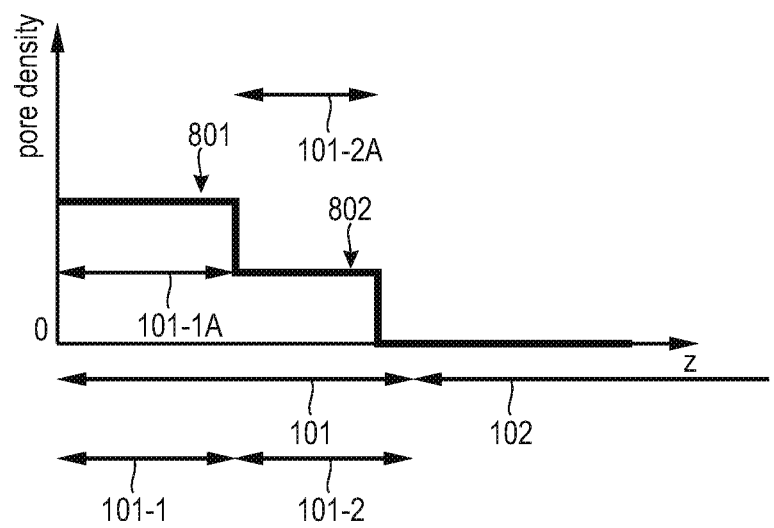
FIG. 15 schematically illustrates a void density in multiple layers according to various examples.

FIG. 15 illustrates aspects with respect to the pore density as a function of the vertical position. In the scenario of FIG. 15, the interface layer 101 includes two sublayers 101-1, 101-2 (e.g., obtained from multiple iterations of an electrochemical etching process with adjusted process parameters). The sublayer 101-1 is adjacent to the substrate 130 and the sublayer 101-2 is adjacent to the device layer 102.

As illustrated, the sublayer 101-1 has a higher pore density 801 if compared to the pore density 802 of the sublayer 101-2.

On a general level, there may be a tendency to decrease the pore density 801, 802 for increasing distances along the vertical Z-direction to the substrate 130. Thereby, the seed condition for epitaxial growth of the device layer 102 can be improved. Specifically, the morphology can be improved.

Different pore densities 801, 802 can be achieved, e.g., by varying the current density of the electrochemical etching.

For example, the sublayer 101-1 may have a pore density in the range of 40% to 70%; while the sublayer 101-2 may have a pore density in the range of 10% to 50%.

In some examples, the sublayer 101-1 may form an interconnected network of pores 601; while the sublayer 101-2 may not form an interconnected network of pores 601.

For example, a thickness 101-1A of the sublayer 101-1 may be in the range of 0.5 µm to 50 µm. A thickness 101-2A can be in the range of 0.2 µm to 20 µm. Hence, the sublayer 101-2 may have a smaller vertical extension if compared to the sublayer 101-1.

Summarizing, above, various techniques have been described which facilitate forming semiconductor devices in a device layer of epitaxial SiC. The device layer is provided on an interface layer which includes cavities such as pores or voids. The interface layer is provided on a SiC substrate or defined in the SiC substrate close to its front side.

These techniques facilitate production of high-quality, high-yield power semiconductor devices. For example, the device layer—depending on the particular type of semiconductor device—may include a layer stack including drain or emitter region and, optionally, a buffer region, a drift region, a p-doped body region and/or a source region or a frontside emitter.

The interface layer provides functionality with respect to separating the substrate from the device layer; and/or functionality with respect to a barrier against propagation of defects.

Summarizing, the following examples have been described:

Although the invention has been shown and described with respect to certain preferred embodiments, equivalents and modifications will occur to others skilled in the art upon the reading and understanding of the specification. The present invention includes all such equivalents and modifications and is limited only by the scope of the appended claims.

For illustration, various techniques with respect to separating the device layer from the substrate at the interface layer have been described for scenarios in which the interface layer includes voids. Similar techniques may be readily applied to scenarios in which the interface layer includes pores.

For further illustration, various techniques have been described with respect to methods including providing the device layer and the interface layer. Respective wafers can be obtained from such methods, wherein the wafers have structural properties characterized by such methods.

For further illustration, various techniques have been described in which a trench-fill process is used to define voids in an epitaxially grown layer of SiC as the device layer. The trench-fill process can also be used in connection with a scenario in which the device layer is defined in the substrate.

For still further illustration, various techniques have been described with respect to device layers having a comparably large thickness, e.g., at least 20 µm. Similar techniques may also be provided for comparably thin device layers, e.g., having a thickness of at most 20 µm.

For still further illustration, while various scenarios have been described with respect to SiC as semiconductor material, similar techniques may be implemented in other kinds and types of wide band-gap semiconductor materials, e.g., GaN, etc.

What is claimed is:

1. A method, comprising:
   providing a layer of porous silicon carbide supported by a silicon carbide substrate;
   providing dopants in the layer of porous silicon carbide such that the layer of porous silicon carbide comprises dopants defining a resistivity of the layer of porous silicon carbide and the resistivity of the layer of porous silicon carbide is different from a resistivity of the silicon carbide substrate;

providing a layer of epitaxial silicon carbide on the layer of porous silicon carbide;

forming a plurality of semiconductor devices in the layer of epitaxial silicon carbide;

separating the silicon carbide substrate from the layer of epitaxial silicon carbide at the layer of porous silicon carbide; and after the separating, removing the layer of porous silicon carbide from the layer of epitaxial silicon carbide.

2. The method of claim 1, wherein a thickness of the layer of epitaxial silicon carbide is at least 20 μm or at most 30 μm.

3. The method of claim 1, wherein the layer of porous silicon carbide comprises an interconnected network of pores.

4. The method of claim 1, wherein the layer of porous silicon carbide comprises a first sublayer having a first pore density and a second sublayer having a second pore density, wherein the first sublayer is arranged in between the second sublayer and the silicon carbide substrate, and wherein the first pore density is larger than the second pore density.

5. The method of claim 1, wherein providing the layer of porous silicon carbide comprises using an epitaxial growth process.

6. The method of claim 1, wherein providing the layer of porous silicon carbide comprises using an electrochemical etching process.

7. The method of claim 1, wherein providing the layer of epitaxial silicon carbide comprises using an epitaxial growth process, wherein the layer of epitaxial silicon carbide comprises a first sublayer and a second sublayer, wherein the first sublayer is arranged in between the second sublayer and the layer of porous silicon carbide, and wherein a growth rate of the epitaxial growth process of the first sublayer is smaller than a growth rate of the epitaxial growth process of the second sublayer.

8. The method of claim 1, further comprising:
planarizing the layer of porous silicon carbide prior to providing the layer of epitaxial silicon carbide.

9. The method of claim 1, wherein the layer of porous silicon carbide comprises a light-absorbing material, and wherein separating the silicon carbide substrate from the layer of epitaxial silicon carbide comprises damaging the layer of porous silicon carbide using laser light absorbed by the light-absorbing material.

10. The method of claim 9, wherein the light-absorbing material comprises dopants and/or at least one carbon layer obtained from a tempering process used for providing the layer of porous silicon carbide.

11. The method of claim 1, wherein separating the silicon carbide substrate from the layer of epitaxial silicon carbide comprises:
injecting a fluid into the layer of porous silicon carbide and cooling the fluid below its freezing point; and/or
rapid pressure changes; and/or
micro-electro-discharge-machining at the layer of epitaxial silicon carbide.

12. The method of claim 1, further comprising:
providing a protection material at vertical edges etched into the layer of epitaxial silicon carbide.

13. The method of claim 1, further comprising:
vertically dicing the layer of epitaxial silicon carbide to singulate the semiconductor devices of the plurality of semiconductor devices,
wherein the layer of epitaxial silicon carbide is diced prior to separating the silicon carbide substrate from the layer of epitaxial silicon carbide.

14. The method of claim 1, further comprising:
after removing the layer of porous silicon carbide from the layer of epitaxial silicon carbide, depositing a backside metallization layer on the layer of epitaxial silicon carbide.

15. The method of claim 1, wherein the layer of porous silicon carbide is provided at a first growth rate, wherein the layer of epitaxial silicon carbide is provided at a second growth rate, and wherein the first growth rate is smaller than the second growth rate.

16. The method of claim 1, further comprising:
defining a drift region of the plurality of semiconductor devices in the layer of epitaxial silicon carbide; and
defining a drain region or a backside emitter region of the plurality of semiconductor devices in the layer of epitaxial silicon carbide,
wherein a thickness of the drain region or the backside emitter region is larger than a thickness of the drift region.

17. A method, comprising:
providing an interface layer supported by a silicon carbide substrate, the interface layer comprising silicon carbide with pores;
providing dopants in the interface layer that define a resistivity of the interface layer;
providing a layer of epitaxial silicon carbide on the interface layer;
forming a plurality of semiconductor devices in the layer of epitaxial silicon carbide;
separating the silicon carbide substrate from the layer of epitaxial silicon carbide at the interface layer; and
after the separating, removing the interface layer from the layer of epitaxial silicon carbide,
wherein the separating comprises:
depositing a layer including a polymer or polymers, which has a different thermal expansion coefficient than the silicon carbide substrate, on a front side of the layer of epitaxial silicon carbide; and
cooling the polymer or polymers to induce a mechanical stress.

18. The method of claim 17, wherein the layer consists of the polymer or polymers.

19. A method, comprising:
providing a layer of porous silicon carbide supported by a silicon carbide substrate;
providing dopants in the layer of porous silicon carbide that define a resistivity of the layer of porous silicon carbide;
providing a layer of epitaxial silicon carbide on the layer of porous silicon carbide;
forming a plurality of semiconductor devices in the layer of epitaxial silicon carbide; and
separating the silicon carbide substrate from the layer of epitaxial silicon carbide at the layer of porous silicon carbide; and
after the separating, removing the layer of porous silicon carbide from the layer of epitaxial silicon carbide;
wherein providing the layer of epitaxial silicon carbide comprises:
defining a drift region of the plurality of semiconductor devices in the layer of epitaxial silicon carbide; and defining a drain region or a backside emitter region of the plurality of semiconductor devices in the layer of epitaxial silicon carbide,
wherein a thickness of the drain region or the backside emitter region is larger than a thickness of the drift region.

* * * * *

UNITED STATES PATENT AND TRADEMARK OFFICE
CERTIFICATE OF CORRECTION

PATENT NO. : 12,272,738 B2
APPLICATION NO. : 18/351600
DATED : April 8, 2025
INVENTOR(S) : Schulze et al.

Page 1 of 1

It is certified that error appears in the above-identified patent and that said Letters Patent is hereby corrected as shown below:

In the Claims

Column 20, Line 58 (Claim 19, Line 10), please change "carbide; and" to -- carbide; --.

Signed and Sealed this
Eighth Day of July, 2025

Coke Morgan Stewart
*Acting Director of the United States Patent and Trademark Office*